(12) United States Patent
Sheridan et al.

(10) Patent No.: US 12,400,940 B1
(45) Date of Patent: Aug. 26, 2025

(54) LEAD FRAME DEVICE WITH SHARED TERMINAL

(71) Applicant: Saras Micro Devices, Inc., Chandler, AZ (US)

(72) Inventors: Richard P. Sheridan, Gilbert, AZ (US); Imran Khan, Alpharetta, GA (US)

(73) Assignee: Saras Micro Devices, Inc., Chandler, AZ (US)

( * ) Notice: Subject to any disclaimer, the term of this patent is extended or adjusted under 35 U.S.C. 154(b) by 0 days.

(21) Appl. No.: 18/810,963

(22) Filed: Aug. 21, 2024

(51) Int. Cl.
  *H01L 23/495* (2006.01)
  *H01L 21/48* (2006.01)
  *H10D 1/68* (2025.01)

(52) U.S. Cl.
  CPC .... *H01L 23/49589* (2013.01); *H01L 21/4842* (2013.01); *H10D 1/68* (2025.01)

(58) Field of Classification Search
  None
  See application file for complete search history.

(56) References Cited

U.S. PATENT DOCUMENTS

| | | | |
|---|---|---|---|
| 2019/0287880 A1* | 9/2019 | Somma | H01L 23/49548 |
| 2021/0151251 A1* | 5/2021 | Saklang | H01L 23/49551 |
| 2023/0067888 A1 | 3/2023 | Sundaram et al. | |
| 2023/0073898 A1 | 3/2023 | Shafiei et al. | |
| 2024/0021436 A1* | 1/2024 | Ewald | H01L 23/49562 |

* cited by examiner

*Primary Examiner* — Michelle Mandala
(74) *Attorney, Agent, or Firm* — Stetina Garred Brucker & Newboles (57) ABSTRACT

A method of manufacturing a semiconductor device includes providing a conductive frame defining first and second rails, a first terminal disposed between the rails, and a plurality of second terminals extending toward the first terminal from one or both of the rails, disposing a plurality of unencapsulated stacks of capacitor(s) on the frame, each of the stacks having electrically isolated first and second contacts and being disposed with the first contact electrically connected to the first terminal and the second contact electrically connected to one of the second terminals, encapsulating the plurality of stacks, and removing the rails from the frame. The method may include electrically connecting the first terminal to a ground line of the semiconductor device and electrically connecting each of the second terminals to a respective power rail of the semiconductor device associated with a respective voltage potential.

20 Claims, 8 Drawing Sheets

LEAD FRAME DEVICE WITH SHARED TERMINAL

CROSS-REFERENCE TO RELATED APPLICATIONS

Not Applicable

STATEMENT RE: FEDERALLY SPONSORED RESEARCH/DEVELOPMENT

Not Applicable

BACKGROUND

Foil-based capacitor components available today consist of a single capacitive element with a single cathode and a single anode limiting them to a single capacitance capable of servicing one power rail of a semiconductor device at a time. To service multiple power rails at different voltage potentials with multiple capacitance values conventionally involves the use of multiple discrete components, requiring a relatively large amount of space on a printed circuit board (PCB) and complicating assembly by requiring multiple individual placements. For some applications, such as high-performance computing (e.g., data centers, artificial intelligence and deep learning, mobile computing platforms, GPUs, FPGA logic), the multiple processor cores requiring multiple power rails may benefit from smaller capacitor footprints and more efficient assembly than is available using current technology.

BRIEF SUMMARY

The present disclosure contemplates various devices and methods for overcoming drawbacks accompanying the related art. One or more aspects of the embodiments of the present disclosure is a method of manufacturing a semiconductor device, which may comprise a lead frame device capable of servicing multiple power rails of the semiconductor device at different voltage potentials. The method may comprise providing a conductive frame defining first and second rails, a first terminal disposed between the first and second rails, and a plurality of second terminals extending toward the first terminal from one or both of the first and second rails with a respective gap between the first terminal and each second terminal. The method may further comprise disposing a plurality of unencapsulated capacitor stacks on the conductive frame. Each of the stacks may comprise one or more capacitors and electrically isolated first and second contacts and may be disposed so as to bridge the gap between the first terminal of the conductive frame and one of the second terminals of the conductive frame with the first contact electrically connected to the first terminal of the conductive frame and the second contact electrically connected to the one of the second terminals of the conductive frame. The method may further comprise encapsulating the plurality of stacks and removing the first and second rails from the conductive frame.

In another aspect, the method may comprise providing a conductive frame defining first and second rails arranged parallel to each other, a first terminal arranged between the first and second rails, and a plurality of second terminals extending toward the first terminal from one or both of the first and second rails. The method may further comprise disposing a plurality of unencapsulated capacitor stacks on the conductive frame. Each of the stacks may comprise one or more capacitors and electrically isolated first and second contacts and may be disposed with the first contact electrically connected to the first terminal of the conductive frame and the second contact electrically connected to a respective one of the second terminals of the conductive frame. A capacitance of a first of the stacks may be different from a capacitance of a second of the stacks. The method may further comprise encapsulating the plurality of stacks and removing the first and second rails from the conductive frame.

In another aspect, the method may comprise providing a conductive frame defining first and second rails, a first terminal disposed between the first and second rails, and a plurality of second terminals extending toward the first terminal from one or both of the first and second rails with a respective connecting bar between the first terminal and each second terminal. The method may further comprise disposing a plurality of unencapsulated capacitor stacks on the conductive frame. Each of the stacks may comprise one or more capacitors and electrically isolated first and second contacts and may be disposed with the first contact electrically connected to the first terminal of the conductive frame and the second contact electrically connected to one of the second terminals of the conductive frame. The method may further comprise encapsulating the plurality of stacks, removing the first and second rails from the conductive frame, and removing at least portions of the connecting bars from between the first terminal and the respective second terminals.

The method of any of the above aspects may comprise deforming at least one of the plurality of second terminals to extend around the plurality of stacks from a first side of the plurality of stacks that faces the conductive frame to a second side of the plurality of stacks opposite the first side. The first terminal may be connected to the first and second rails by respective first and second segments of the conductive frame. The method may comprise deforming at least one of the first and second segments to extend around the plurality of stacks from the first side of the plurality of stacks to the second side of the plurality of stacks. The plurality of second terminals may include at least two second terminals extending toward the first terminal from the first rail. The first segment may be between an adjacent pair of the at least two second terminals extending toward the first terminal from the first rail. The plurality of second terminals may include at least one second terminal extending toward the first terminal from the first rail and at least one second terminal extending toward the first terminal from the second rail. The plurality of second terminals may include at least two second terminals extending toward the first terminal from the first rail and at least two second terminals extending toward the first terminal from the second rail. The first terminal may be connected to the first and second rails by respective first and second segments of the conductive frame. The first segment may be between an adjacent pair of the at least two second terminals extending toward the first terminal from the first rail. The second segment may be between an adjacent pair of the at least two second terminals extending toward the first terminal from the second rail. The conductive frame may further define a plurality of connecting bars between the first terminal and the plurality of second terminals. The method may further comprise removing at least portions of the connecting bars to electrically isolate the first terminal from the plurality of second terminals. The at least portions of the connecting bars may be partially etched. Removing the at least portions of the connecting bars may include etching the partially etched at least portions of the connecting bars.

A method of manufacturing a semiconductor device may comprise in, addition to the method of any of the above aspects, electrically connecting the first terminal of the conductive frame to a ground line of the semiconductor device and electrically connecting each of the second terminals of the conductive frame to a respective power rail of the semiconductor device associated with a respective voltage potential. Both embedded applications within the package of the semiconductor device and surface mount applications on a PCB outside the semiconductor device are contemplated.

Another aspect of the embodiments of the present disclosure is a lead frame device for servicing multiple power rails of a semiconductor device at different voltage potentials. The lead frame device may comprise a conductive frame made of a single sheet of metal. The conductive frame may define a first terminal and a plurality of second terminals extending toward the first terminal with a respective gap between the first terminal and each second terminal. The lead frame device may further comprise a plurality of stacks of unpackaged capacitors. Each of the stacks may have electrically isolated first and second contacts and may bridge the gap between the first terminal of the conductive frame and one of the second terminals of the conductive frame with the first contact electrically connected to the first terminal of the conductive frame and the second contact electrically connected to the respective one of the second terminals of the conductive frame.

At least one of the plurality of second terminals may extend around the plurality of stacks from a first side of the plurality of stacks that faces the conductive frame to a second side of the plurality of stacks opposite the first side. The conductive frame may define first and second segments connected to the first terminal. At least one of the first and second segments may extend around the plurality of stacks from the first side to the second side. At least one of the first and second segments may extend around the plurality of stacks from a first side of the plurality of stacks that faces the conductive frame to a second side of the plurality of stacks opposite the first side. A portion of the first terminal may extend around the plurality of stacks from a first side of the plurality of stacks that faces the conductive frame to a second side of the plurality of stacks opposite the first side.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The present disclosure encompasses various embodiments of semiconductor devices and lead frame devices capable of servicing multiple power rails of a semiconductor device at different voltage potentials, along with lead frames and methods of manufacturing thereof. The detailed description set forth below in connection with the appended drawings is intended as a description of several currently contemplated embodiments and is not intended to represent the only form in which the disclosed subject matter may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

Figure 1:
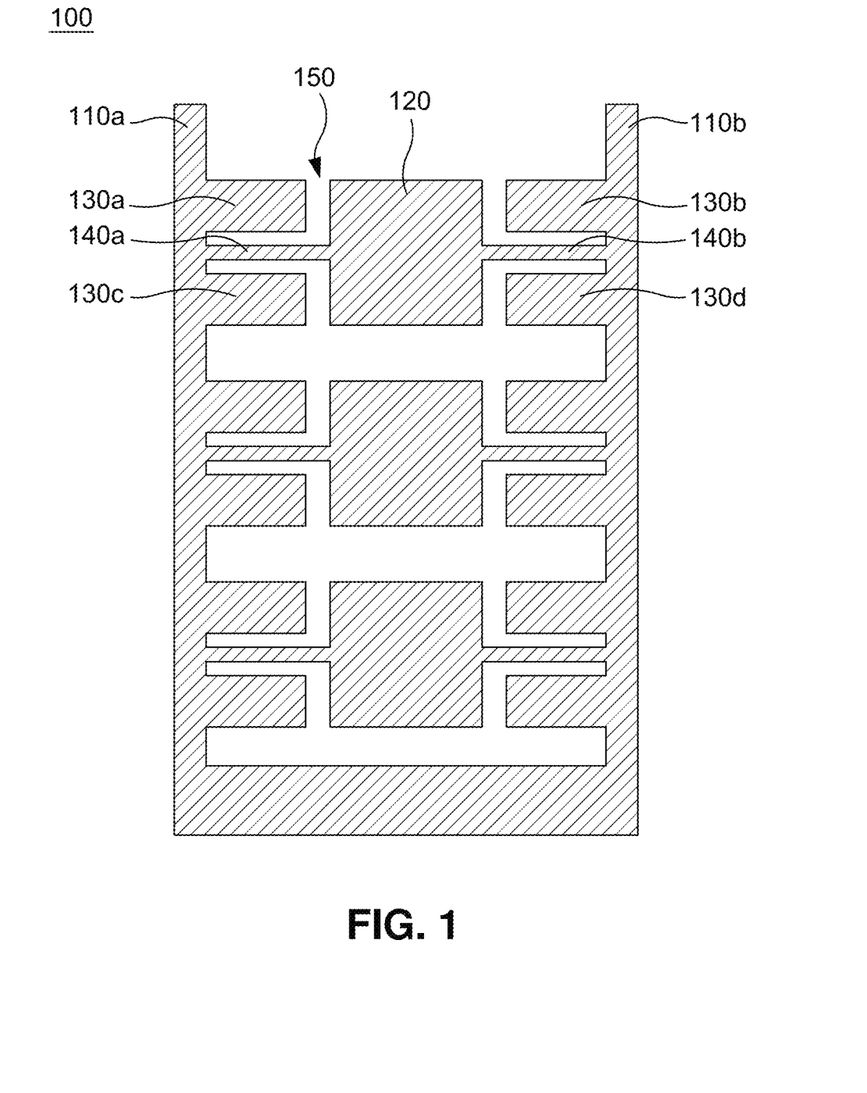
FIG. 1 is a top view of a lead frame.

FIG. 1 is a top view of a lead frame according to an embodiment of the present disclosure. The lead frame may comprise a conductive frame 100, which may be made of a single sheet of metal such as copper that is formed by lead frame processes such as stamping, etching, half-etching, etc. The conductive frame 100 may define first and second rails 110a, 110b arranged parallel to each other, a first terminal 120 arranged between the first and second rails 110a, 110b, and a plurality of second terminals 130a, 130b, 130c, 130d (collectively 130) extending toward the first terminal 120 from one or both of the first and second rails 110a, 110b. As shown in the example of FIG. 1, the first terminal 120 may be connected to the first and second rails 110a, 110b by respective first and second segments 140a, 140b of the conductive frame 100. There may be a respective gap 150 between each second terminal 130a, 130b, 130c, 130d and the first terminal 120, allowing for isolation of the first terminal from the second terminals 130a, 130b, 130c, 130d upon removal of the rails 110a, 110b. Owing to the shared use of the first terminal 120 by electrodes of a plurality of capacitors as described herein, the disclosed lead frame may advantageously be used to manufacture an lead frame device or integrated passive device (IPD) that is capable of servicing multiple voltage domains such as multiple power rails of a power delivery network of a semiconductor device at different voltage potentials, simplifying assembly, reducing footprint on a printed circuit board (PCB), and increasing capacitive volumetric density.

Figure 2A:
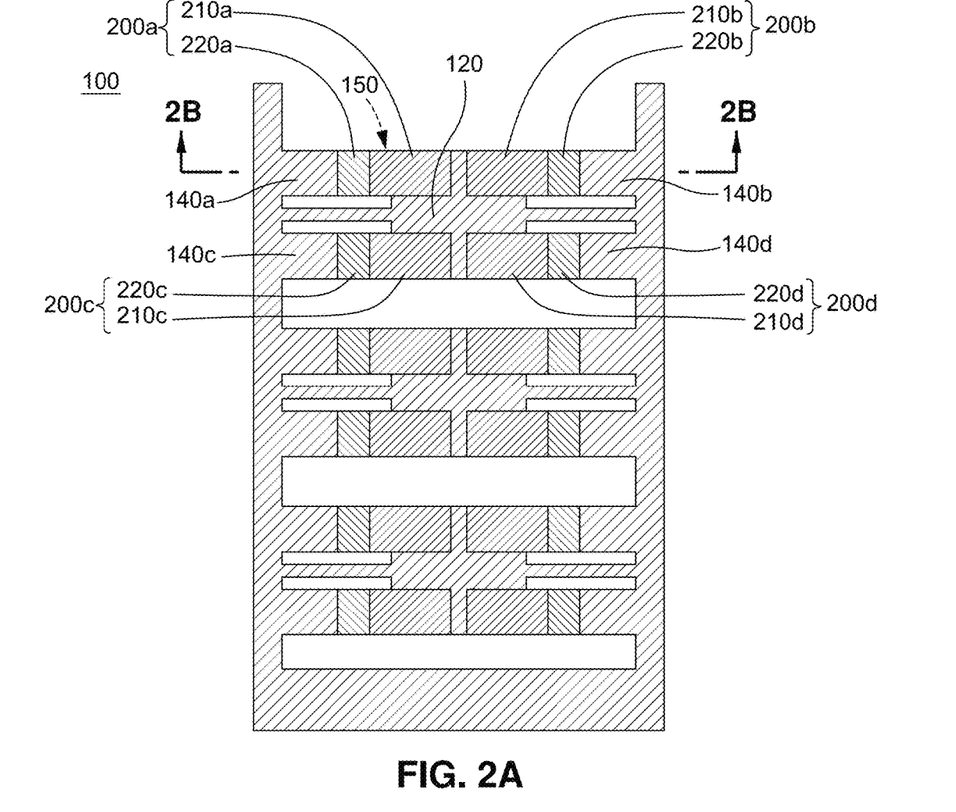
FIG. 2A is a top view of a processing stage in manufacturing a lead frame device using the lead frame of FIG. 1.

In the illustrated example, the first terminal 120 is associated with four second terminals 130a, 130b, 130c, 130d. The arrangement of one first terminal 120 and four associated second terminals 130a, 130b, 130c, 130d (as well as two segments 140a, 140b) may repeat multiple times between a single pair of rails 110a, 110b as shown, allowing for mass production of the disclosed devices from a single lead frame. Referring to FIG. 2A, a method of manufacturing a lead frame device using the disclosed lead frame may begin with disposing a plurality of unencapsulated capacitor stacks 200a, 200b, 200c, 200d (collectively 200), each comprising one or more capacitors, on the conductive frame 100. As shown in cross-section in FIG. 2B, each stack 200 may be a stack of valve metal capacitive elements having a first contact 210a, 210b, 210c, 210d (collectively 210) electrically connected to a cathode of each capacitive element and a second contact 220a, 220b, 220c, 220d (collectively 220) electrically connected to an anode of each capacitive element. It is contemplated that the stacks 200 (and constituent capacitors thereof) may be in a semi-finished, unencapsulated, unpackaged state when disposed on the conductive frame 100. Each individual capacitor or capacitive element of each stack 200 may comprise a conductive substrate serving as an anode that is made of aluminum, an aluminum alloy, or another material (e.g., tantalum) that is etched or otherwise modified to have a high surface area, such as an etched aluminum foil as described in Applicant's own U.S. Patent Application Pub. No. 2023/0067888 ("the '888 publication"), entitled "Planar High-Density Aluminum Capacitors for Stacking and Embedding," the entire contents of which is incorporated by reference herein. Alternative or additional modifications to increase the surface area of the conductive substrate may include deposition of a sintered aluminum powder or other aluminum, aluminum oxide, titanium, or titanium oxide powder thereon. The conductive substrate may be a metal foil as described in Applicant's own U.S. Patent Application Pub. No. 2023/0073898, entitled "Modified Metal Foil Capacitors and Methods for Making Same," the entire contents of which is incorporated by reference herein. The conductive substrate may thus comprise a solid metal portion (represented by reference number) and a high surface area (HSA) portion on front and back sides thereof. A layer buildup may then be formed on the HSA portion wrapping around the conductive substrate on both sides.

Figure 2B:
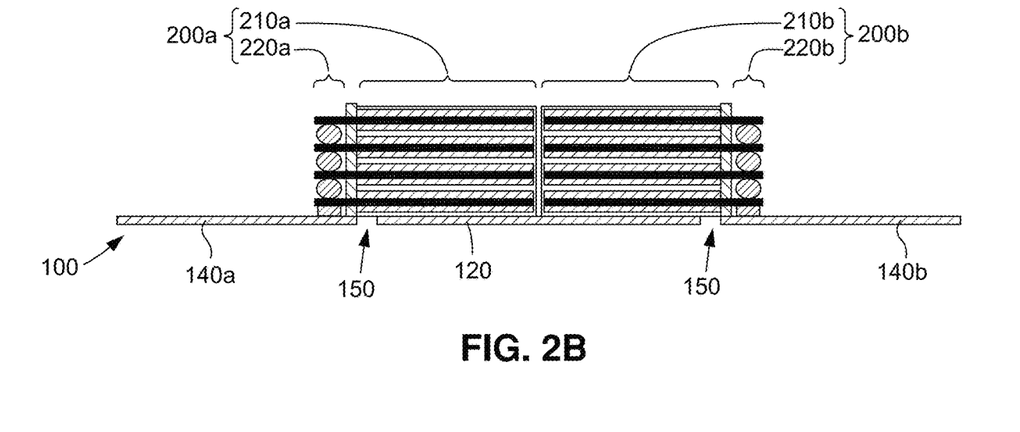
FIG. 2B is a cross-sectional view taken along the line 2B-2B in FIG. 2A.

More specifically, the HSA portion of each conductive substrate may include, conformal therewith, a dielectric layer such as a naturally occurring oxide layer (e.g., an aluminum oxide layer) or one that has been grown by an anodization process (e.g., by placing the conductive substrate in an electrolytic solution and passing a current through the solution), grown by thermal oxidation in a humidity chamber, or coated on the conductive substrate (e.g., by atomic layer deposition). As may be appreciated, the dielectric layer may, in general, exhibit the same high surface area as the underlying HSA portion of the conductive substrate as it fills in and takes the shape of the various tunnels and recesses that may result from the etching or other modification to the material of the conductive substrate. A portion of the dielectric layer may also be formed directly on the solid metal portion as it wraps around the edge of the conductive substrate. The HSA portion of the conductive substrate may further include, conformal therewith, a conductive polymer layer that is electrically isolated from the conductive substrate by the dielectric layer and may exhibit the same high surface area as the underlying conductive substrate as it fills in and takes the shape of the various tunnels and recesses that may result from the etching or other modification to the material of the conductive substrate, with the dielectric layer sandwiched therebetween. The conductive polymer layer may serve as a cathode of the capacitor. Similarly to the dielectric layer, a portion of the conductive polymer layer may wrap around the edge of the conductive substrate, but with the dielectric layer therebetween. A variety of conductive polymers may be suitable for use as the conductive polymer layer serving as the second electrode of the capacitor described herein. The conductive polymer layer may, for example, comprise one or more of a polypyrrole, a polythiophene, a polyaniline, a polyacetylene, a polyphenylene, a poly(p-phenylene-vinylene), PEDOT: PSS (poly(3,4-ethylenedioxythiophene) polystyrene sulfonate), or P3HT (poly(3-hexylthiophene-2, 5-diyl)). In some cases, TiN or Pt may be used in place of the conductive polymer.

In addition to the dielectric layer and the conductive polymer layer serving as the cathode, the layer buildup may include additional layers on the conductive polymer layer in order to improve the electrical connection between the conductive polymer layer and the conductive frame 100. For example, a carbonaceous layer (e.g., a carbon ink) and/or a metallization layer (e.g., Ag or Ti/Cu) may be applied on the conductive polymer layer. The carbonaceous layer may be applied in direct, physical contact with the conductive polymer layer, and the metallization layer may be applied in direct, physical contact with the carbonaceous layer. Preferably, the application of the metallization layer may comprise depositing a diffusion barrier on the conductive polymer layer (e.g., directly in contact with the carbonaceous layer thereon) and depositing metal adjacent the diffusion barrier. The carbonaceous layer, if included, may advantageously reduce a contact resistance between the conductive polymer layer and other components, such as a diffusion barrier layer of the metallization layer. The carbonaceous layer may include, for example, carbon black, graphite, a carbon-based ink, or a polymeric, and may be applied using a variety of techniques, such as screen printing, inkjet printing, sputter deposition, vacuum deposition, spin coating, doctor blading, or the like. The metallization layer may be used to provide high-quality electrical conductivity between the respective conductive polymer layer (acting as the second electrode of the capacitor) and the conductive frame 100. The metallization layer may include a metal such as Ag, Au, Cu, Pt, Pd, and/or composites or alloys of the aforementioned metals, or in some cases polymers such as epoxies, silicones, or fluoroelastomers. Including a diffusion barrier layer in the metallization layer may limit infiltration of components from the metallization layer into the carbonaceous layer or conductive polymer layer. Example materials for a diffusion barrier layer include, but are not limited to, Ti, W, Cr, Ti-W, TaN, and/or Co-W. The metallization layer, as well as any diffusion barrier layer thereof, may be applied using any suitable techniques, such as vacuum deposition (e.g., sputter deposition).

Within each capacitor stack 200, the metallization layer that is electrically connected to the conductive polymer layers serving as the cathodes of the individual capacitive elements may define a first contact 210a, 210b, 210c, 210d, while the conductive substrates serving as the anodes of the constituent capacitive elements may be electrically connected together (e.g., by conductive spacers as shown or simply by being pinched together and resistance welded) to define a second contact 220a, 220b, 220c, 220d corresponding to the anodes of the individual capacitive elements. The second contact 220a, 220b, 220c, 220d of each stack 200 may be electrically isolated from the first contact 210a, 210b, 210c, 210d. Each of the stacks 200, may be disposed so as to bridge the gap 150 between the first terminal 120 of the conductive frame 100 and one of the second terminals 130a, 130b, 130c, 130d of the conductive frame 100 with the first contact 210a, 210b, 210c, 210d electrically connected to the first terminal 120 of the conductive frame 100 and the second contact 220a, 220b, 220c, 220d electrically connected to the one of the second terminals 130a, 130b, 130c, 130d of the conductive frame 100.

Figure 3A:
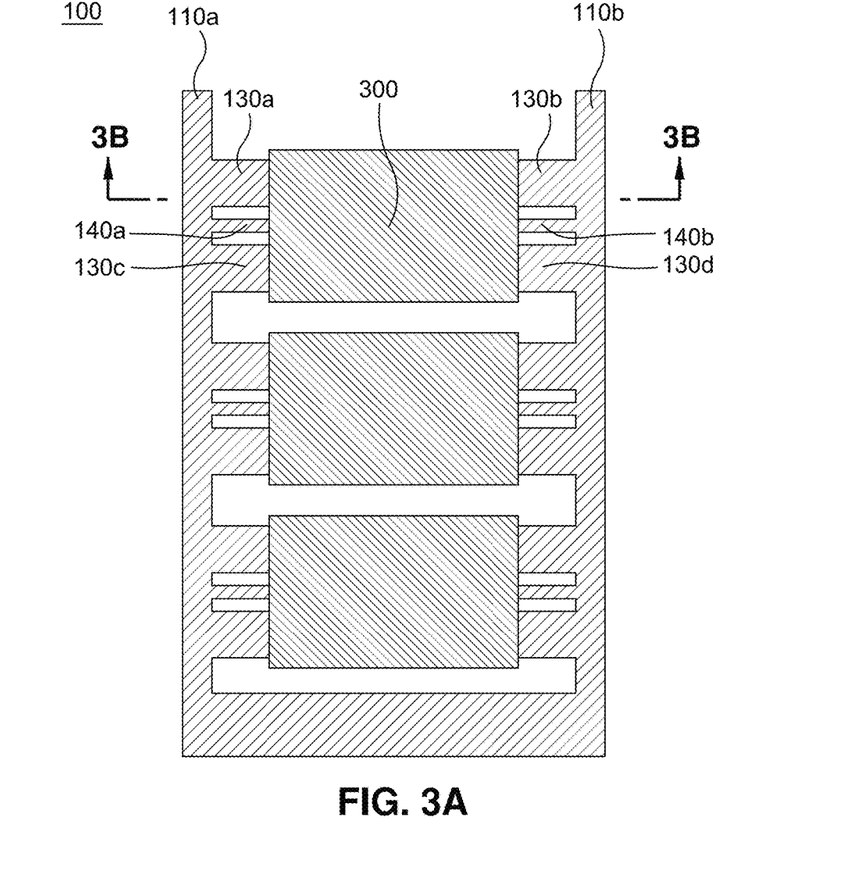
FIG. 3A is a top view of another processing stage in manufacturing the lead frame device.
Figure 3B:
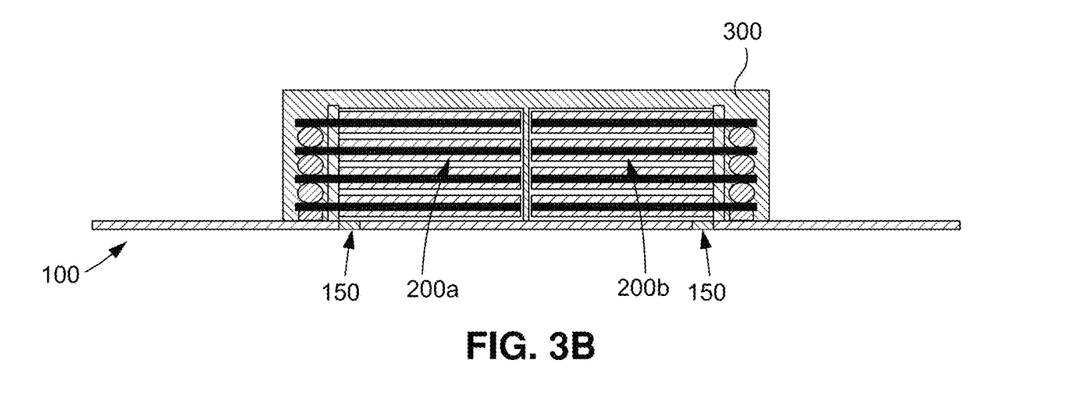
FIG. 3B is a cross-sectional view taken along the line 3B-3B in FIG. 3A.
Figure 4:
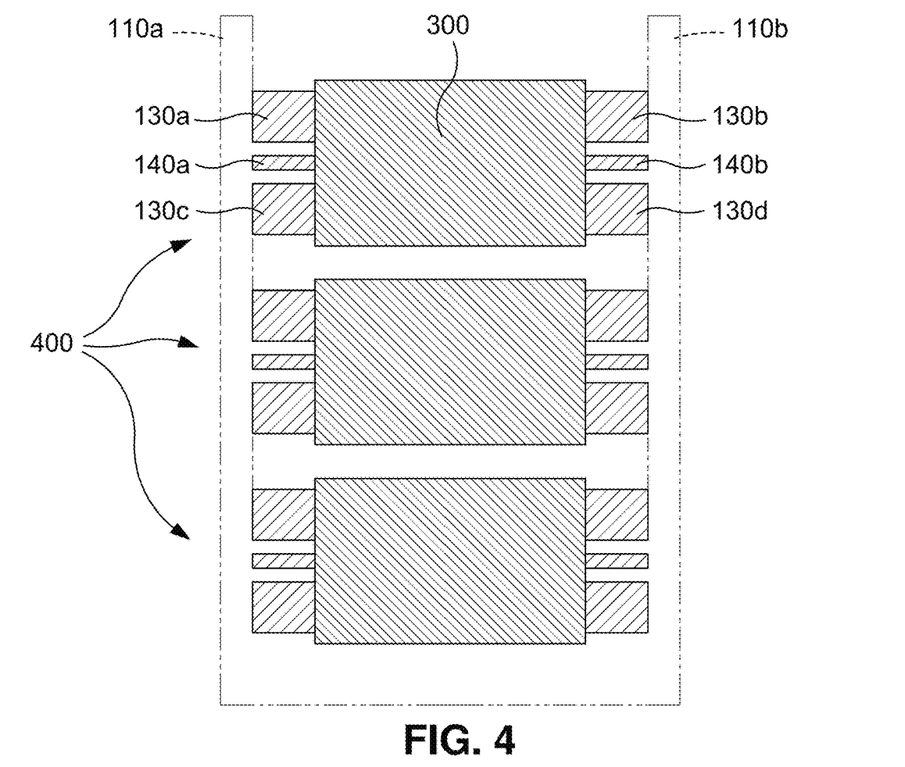
FIG. 4 is a top view of another processing stage in manufacturing the lead frame device.

Referring to FIGS. 3A and 3B, the method of manufacturing the lead frame device may continue with encapsulating the plurality of stacks 200 with an encapsulant 300 (e.g., a polymer such as an epoxy resin), the surface of which may be planarized as desired. As shown in FIG. 4, the first and second rails 110a, 110b may be removed from the conductive frame 100, e.g., by sawing, punching, etching, or a combination thereof. In this way, the individual lead frame devices 400 (three shown in FIG. 4) may be singulated. At the same time, the removal of the rails 110a, 110b may electrically isolate the first terminal 120 from the second terminals 130a, 130b, 130c, 130d as well as electrically isolate the second terminals 130a, 130b, 130c, 130d from each other. In this way, each individual encapsulated lead frame device 400 or IPD may include a plurality of stacks 200 of capacitors, with each stack 200 sharing a central cathode terminal 120 while having different electrically isolated anode terminals 130a, 130b, 130c, 130d. By connecting the anode terminals 130a, 130b, 130c, 130d to different power rails, for example, a single IPD as described herein may service a plurality of voltage domains with reduced footprint and without requiring individual placements of each capacitor stack 200 (e.g., four or more placements) during assembly.

Figure 5A:
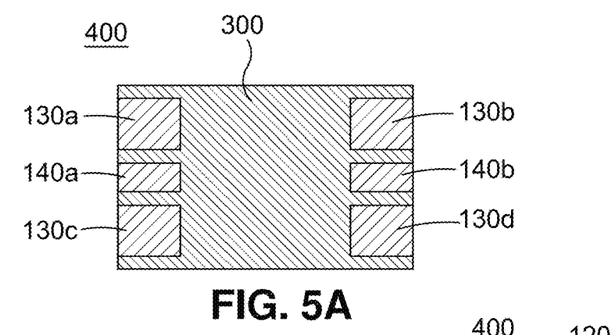
FIG. 5A is a top view of the lead frame device.
Figure 5B:
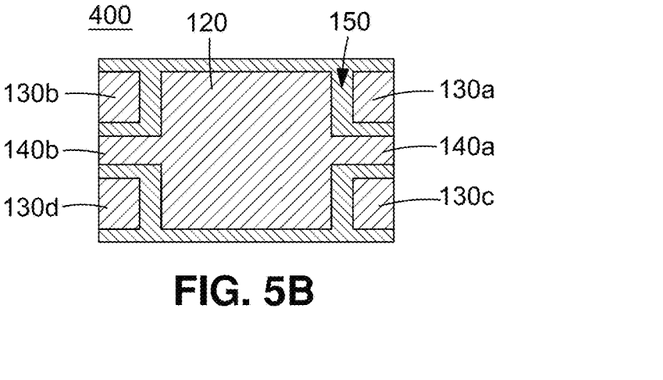
FIG. 5B is a bottom view of the lead frame device.

As shown in the respective top and bottom views of FIGS. 5A and 5B (depicting the resulting singulated lead frame device 400 or IPD), one or more of the second terminals 130a, 130b, 130c, 130d (now defining the leads of the lead frame device 400) may be deformed so as to extend around the encapsulated stacks 200 from a first side (e.g., bottom) of the encapsulated stacks 200 that faces the conductive frame 100 to a second side (e.g., top) of the encapsulated stacks 200 opposite the first side. To this end, the second terminals 130a, 130b, 130c, 130d may be made long enough so that enough length remains, after singulation, for wrapping the second terminals 130a, 130b, 130c, 130d around the encapsulant 300. Advantageously, electrical connection to the second terminals 130a, 130b, 130c, 130d may then be possible from both sides of the lead frame device 400, allowing for flexibility in forming connections and obviating a need for dedicated passthrough vias, thereby enabling component stacking and component embedding into PCB and/or packaging substrates of semiconductor devices. In an embodiment such as the illustrated example in which the first terminal 120 is connected to the first and second rails 110a, 110b by respective first and second segments 140a, 140b of the conductive frame 100 (see FIG. 1), one or more of the segments 140a, 140b may similarly be deformed so as to extend around the encapsulated stacks 200 from the first side (e.g., bottom) to the second side (e.g., top). To this end, one or more of the segments 140a, 140b may be made long enough so that enough length remains, after singulation, for wrapping the segments 140a, 140b around the encapsulant 300. In this way, electrical connection to the first terminal 120 may similarly be possible from both sides of the lead frame device 400.

In the example shown in FIGS. 1-5B, each of the segments 140a, 140b that connects the first terminal 120 to the rails 110a, 110b of the conductive frame 100 extends between an adjacent pair of second terminals 130a, 130c or an adjacent pair of second terminals 130b, 130d. However, the disclosed subject matter is not intended to be limited in this respect. For example, the first terminal 120 may instead be connected to the rails 110a, 110b via segment(s) of the conductive frame 100 that extend around the outside of the second terminals 130a, 130b, 130c, 130d, such as via a cross rail that directly connects one rail 110a to the other 110b. In the top view of FIG. 1, for example, such cross rails may be provided as additional horizontal connections between adjacent pairs of first terminals 120, to be later removed during singulation, for example. Such a layout may advantageously reduce the pitch between adjacent pairs of second terminals 130a, 130c (or 130b, 130d), at the expense of an increased distance between lead frame devices in the longitudinal direction of the lead frame (the vertical direction in FIG. 1).

Figure 6:
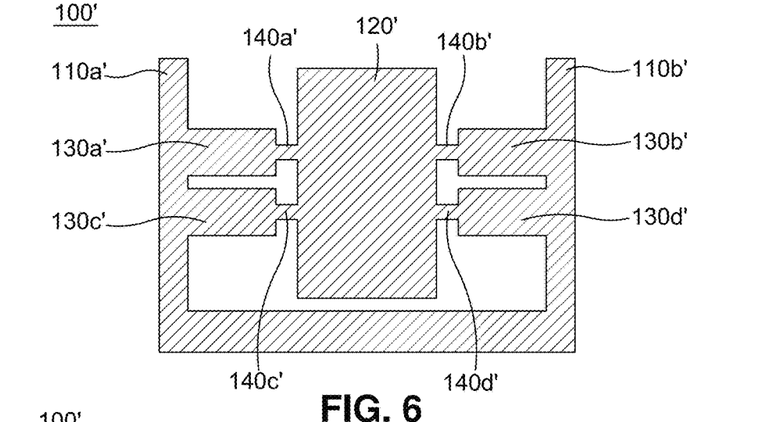
FIG. 6 is a top view of another lead frame.
Figure 7A:
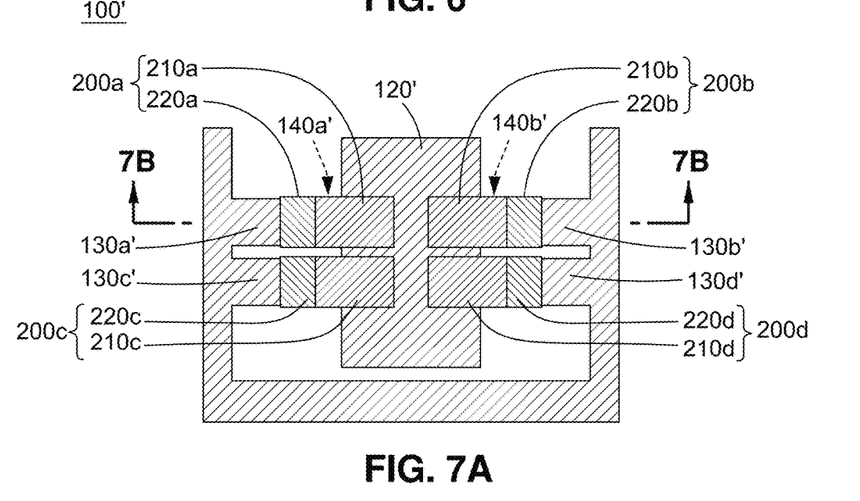
FIG. 7A is a top view of a processing stage in manufacturing a lead frame device using the lead frame of FIG. 6.
Figure 7B:
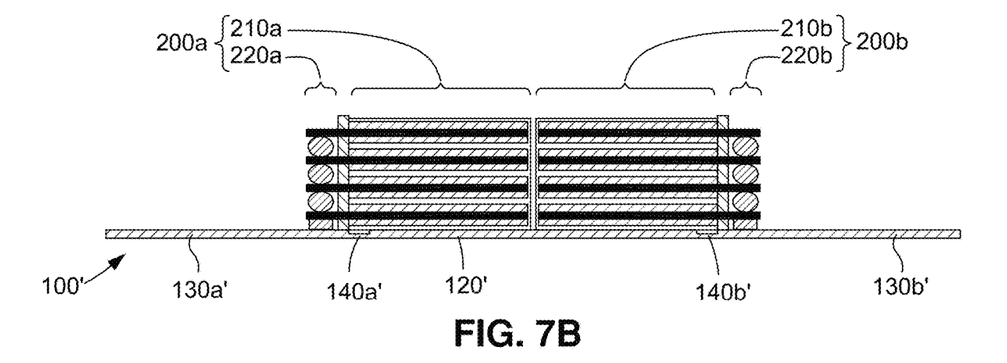
FIG. 7B is a cross-sectional view taken along the line 7B-7B in FIG. 7A.

FIG. 6 is a top view of another lead frame according to an embodiment of the present disclosure. The lead frame of FIG. 6 may comprise a conductive frame 100', which may be the same as the conductive frame 100 except as described herein. In particular, whereas the first terminal 120 of the conductive frame 100 of FIG. 1 is separated by respective gaps 150 from each second terminal 130a, 130b, 130c, 130d, the first terminal 120' of the conductive frame 100' shown in FIG. 6 is initially connected to each respective second terminal 130a', 130b', 130c', 130d' (collectively 130') by respective connecting bars 140a', 140b', 140c', 140d' that may be partially etched (e.g., half-etched) for easy subsequent removal (see partially etched connecting bars 140a', 140b' visible in FIG. 7B). Referring to FIGS. 7A and 7B, a method of manufacturing a lead frame device using the disclosed lead frame of FIG. 6 may begin with disposing a plurality of unencapsulated stacks 200a, 200b, 200c, 200d (collectively 200) of one or more capacitors on the conductive frame 100'. The stacks 200 may be disposed with the first contact 210a, 210b, 210c, 210d electrically connected to the first terminal 120' of the conductive frame 100' and the second contact 220a, 220b, 220c, 220d electrically connected to one of the second terminals 130a', 130b', 130c', 130d' of the conductive frame 100', with the respective connecting bar 140a', 140b', 140c', 140d' therebetween.

Figure 8A:
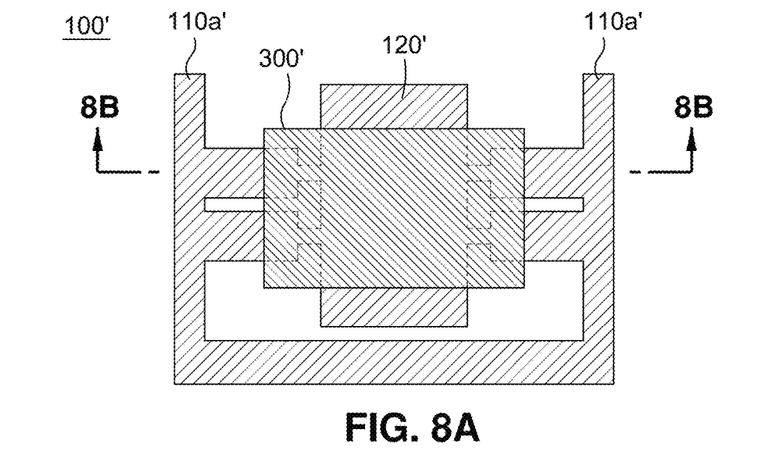
FIG. 8A is a top view of a processing stage in manufacturing the lead frame device.
Figure 8B:
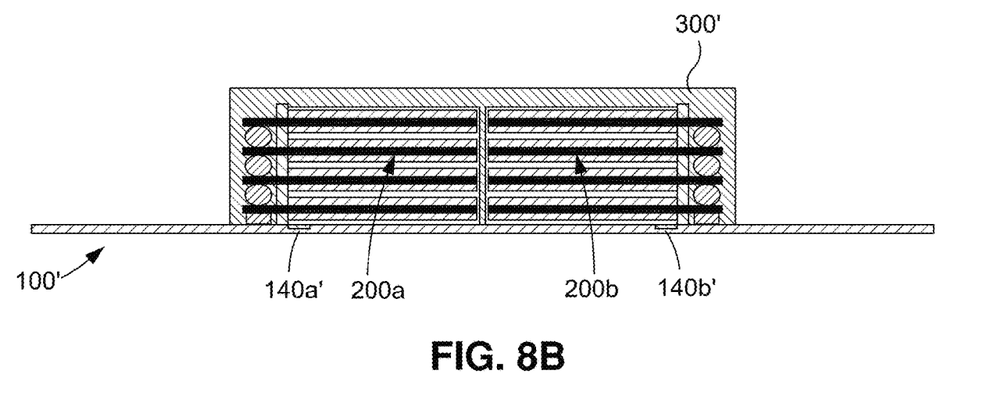
FIG. 8B is a cross-sectional view taken along the line 8B-8B in FIG. 8A.
Figure 8C:
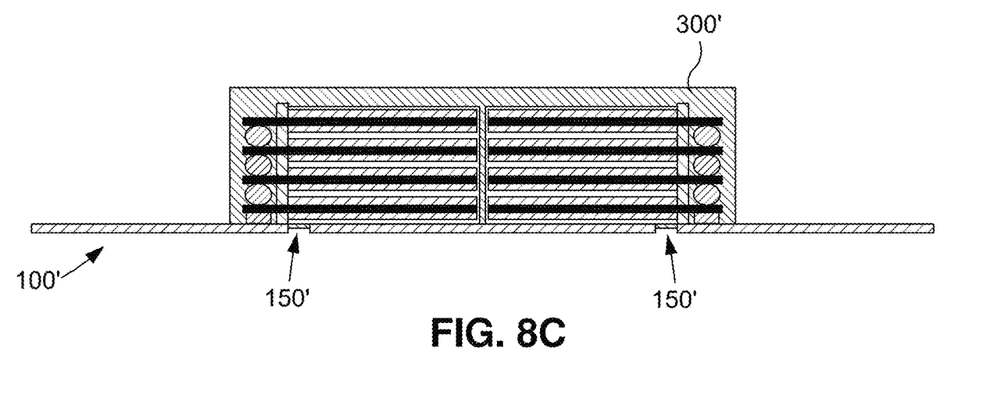
FIG. 8C is a cross-sectional view of another processing stage in manufacturing the lead frame device.

Referring to FIGS. 8A and 8B, the method of manufacturing the lead frame device may continue with encapsulating the plurality of stacks 200 with an encapsulant 300' (e.g., a polymer such as an epoxy resin), the surface of which may be planarized as desired. The partially etched portions 140a', 140b' may then be fully removed as shown in FIG. 8C, resulting in gaps 150' that may be structurally and functionally the same as the gaps 150 of the conductive frame 100 of FIG. 1. As can be seen in FIGS. 8B and 8C, in the case of a partially etched portion 140a', 140b' that is partially etched from the top side of the conductive frame 100', the encapsulant 300' may fill the recess that exists above the partially etched portion 140a', 140b', resulting in some insulating encapsulant 300' within the gap 150'. Alternatively, if it is desired for the gap 150' to contain only air, for example, the partially etched portion 140a', 140b' may instead be partially etched from the bottom side of the conductive frame 100', in which case the resulting gap 150' may contain no encapsulant 300'.

Figure 9:
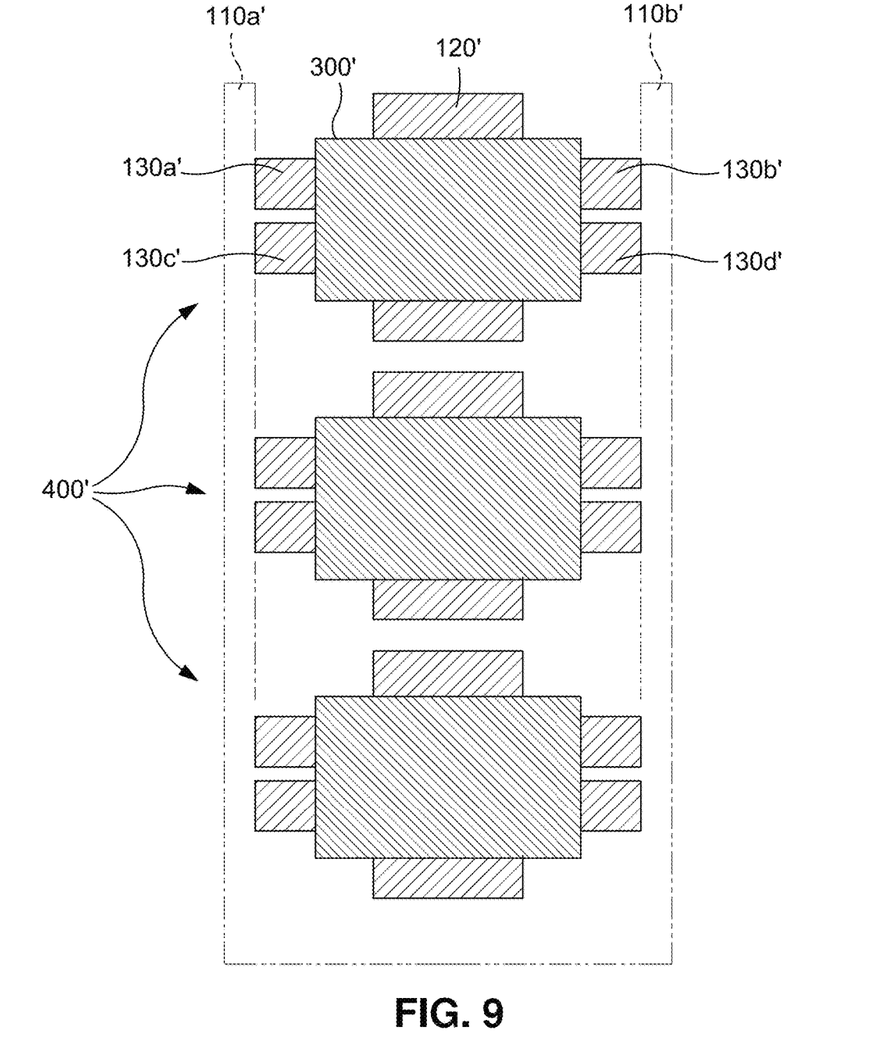
FIG. 9 is a top view of another processing stage in manufacturing the lead frame device.

Turning to FIG. 9, the first and second rails 110a', 110b' may be removed from the conductive frame 100', e.g., by sawing, punching, etching, or a combination thereof. In this way, the individual lead frame devices 400' (three shown in FIG. 9) may be singulated. In this case, following removal of the partially etched portions 140a', 140b', 140c', 140d', the first terminal 120' has already been isolated from the second terminals 130a', 130b', 130c', 130d', but the removal of the rails 110a', 110b' may still serve to electrically isolate the second terminals 130a', 130b', 130c', 130d' from each other. In this way, as in the case of the lead frame device 400 described in relation to FIGS. 1-5B, each individual encapsulated lead frame device 400' or IPD may include a plurality of stacks 200 of capacitors, with each stack 200 sharing a central cathode terminal 120' while having different electrically isolated anode terminals 130a', 130b', 130c', 130d'. By connecting the anode terminals 130a', 130b', 130c', 130d' to different power rails, for example, a single IPD as described herein may service a plurality of voltage domains with reduced footprint and without requiring individual placements of each capacitor stack 200 (e.g., four or more placements) during assembly.

Figure 10A:
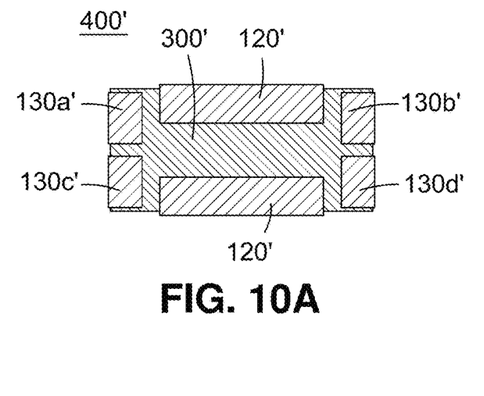
FIG. 10A is a top view of the lead frame device.
Figure 10B:
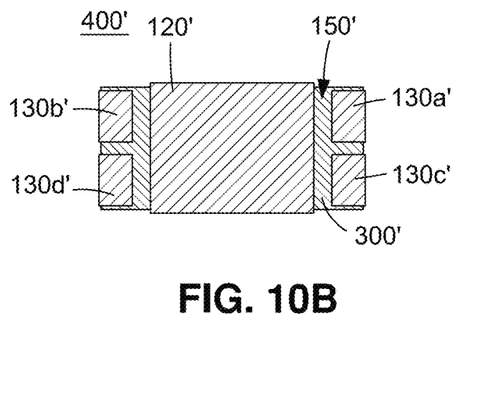
FIG. 10B is a bottom view of the lead frame device.

As shown in the respective top and bottom views of FIGS. 10A and 10B (depicting the resulting singulated lead frame device 400' or IPD), one or more of the second terminals 130a', 130b', 130c', 130d' may be deformed so as to extend around the encapsulated stacks 200 from a first side (e.g., bottom) of the encapsulated stacks 200 that faces the conductive frame 100' to a second side (e.g., top) of the encapsulated stacks 200 opposite the first side. To this end, the second terminals 130a', 130b', 130c', 130d' may be made long enough so that enough length remains, after singulation, for wrapping the second terminals 130a', 130b', 130c', 130d' around the encapsulant 300'. Advantageously, electrical connection to the second terminals 130a', 130b', 130c', 130d' may then be possible from both sides of the lead frame device 400', allowing for flexibility in forming connections and obviating a need for dedicated passthrough vias, thereby enabling component stacking and component embedding into PCB and/or packaging substrates of semiconductor devices. In an embodiment such as the illustrated example in which the first terminal 120' is initially only connected to the first and second rails 110a', 110b' via the second terminals 130a', 130b', 130c', 130d' (e.g., by half-etched portions 140a', 140b', 140c', 140d') and later isolated from the second terminals 130a', 130b', 130c', 130d', it is contemplated that electrical connection to the first terminal 120' from both sides of the lead frame device 400' may still be achieved. For example, a portion of the first terminal 120' itself may extend around the plurality of stacks 200 from the first side to the second side as shown in FIGS. 10A and 10B. To this end, the conductive frame 100' may be designed so that the first terminal 120' is elongated in the longitudinal direction (the vertical direction in FIG. 6), such that enough material of the conductive frame 100' remains to wrap around the encapsulant 300'.

In the illustrated examples, stacks 200 of capacitors are disposed on one side of the conductive frame 100, 100', but it is contemplated that stacks 200 of capacitors may be disposed on both sides (top and bottom) of the conductive frame 100, 100' in some cases, though this may limit the ability to wrap the anode and/or cathode terminals of the conductive frame 100, 100' around each stack 200. It is also contemplated that multiple stacks 200 of capacitors may themselves be stacked on the conductive frame 100, 100' (e.g., a stack of two or more stacks 200) for greater capacitance devices. In some cases, a completed lead frame device 400, 400' as described herein may be embedded in a tile as described in Applicant's own U.S. patent application Ser. No. 18/408,914 ("the '914 application"), filed Jan. 10, 2024 and entitled "Embeddable Tiles Containing Passive Devices for Packaged Semiconductor Devices," the entire contents of which is incorporated by reference herein. It should also be noted that the illustrated number of second terminals 130, 130' (e.g., anodes) is an example only, and that the contemplated lead frame device 400, 400' may have fewer than four (e.g., two or three) second terminals 130, 130' or may have more than four (e.g., five, six, etc.) second terminals 130, 130', with a corresponding number of stacks 200 of capacitors within the single lead frame device 400, 400'.

Figure 11:
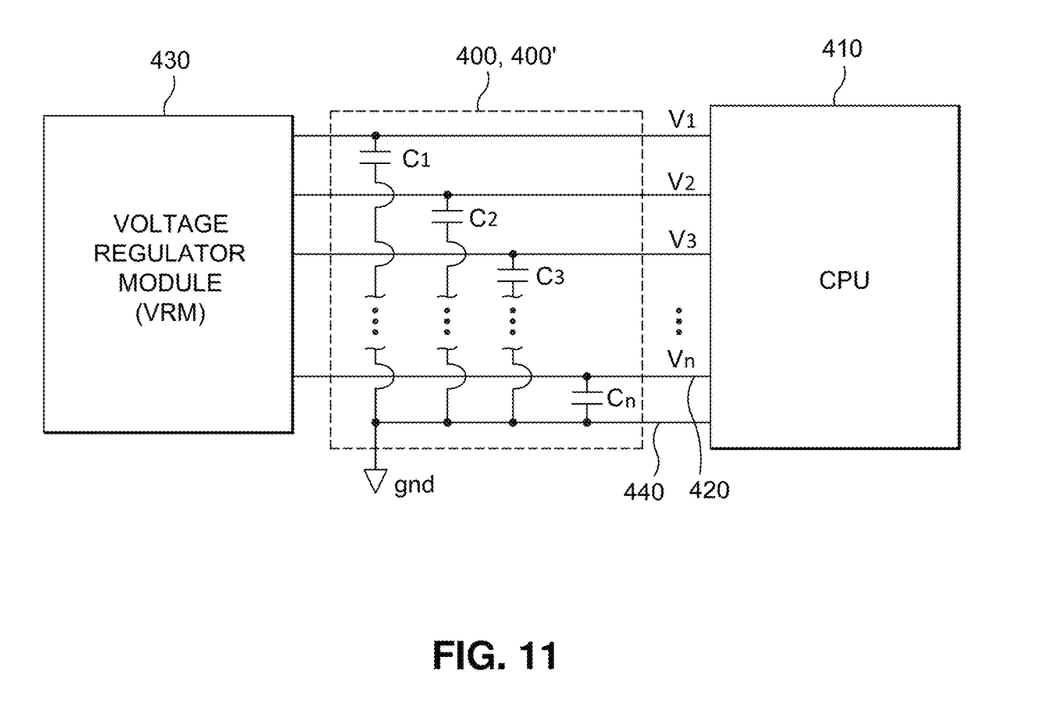
FIG. 11 is a schematic view showing an example placement of a lead frame device.

FIG. 11 shows an example placement of a lead frame device 400, 400' as described herein. The lead frame device 400, 400' may be surface mounted (e.g., on a PCB) and/or embedded (e.g., within a PCB, semiconductor package substrate, interposer, etc.) for any application where multiple capacitors are needed. For example, a CPU 410 or other semiconductor device may have multiple processing cores running on independent power rails 420 at different voltages ($V_1, V_2, V_3, \ldots, V_n$ in FIG. 11), as may be provided by a voltage regulator module (VRM) 430 or other component of a power delivery network (PDN). Each of these independent rails 420 may need to be serviced with independent bypass capacitors ($C_1, C_2, C_3, \ldots, C_n$ in FIG. 11). These capacitors can share their ground return (cathode) terminal but may require independent positive (anode) terminal connections. Whereas typical solutions involve the use of independent discrete capacitors for each of the power rails 410, the disclosed subject matter may allow an arbitrary number (n) of discrete capacitors to be replaced with a single n-anode multi-domain capacitor in the form of the disclosed lead frame device 400, 400'. In particular, each of the second terminals 130, 130' of the lead frame device 400, 400' may be electrically connected to a respective power rail 420 of the semiconductor device 410, and the first terminal 120, 120' may be electrically connected to a ground line 440 of the semiconductor device 410, with the stacks 200 of capacitors thus serving as the capacitors $C_1, C_2, C_3, \ldots, C_n$. In this way, a single capacitive component with multiple discrete anodes sharing a common cathode can service multiple power rails with a single device, greatly reducing the total number of discrete components needed and thereby reducing the total number of surface mount placements and total surface area needed on the system PCB. As an example, in the case of replacing four discrete 2-terminal aluminum polymer capacitors with a single 5-terminal (4 anode+1 shared cathode) component, a typical area reduction may be greater than 35%.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of manufacturing a semiconductor device, the method comprising:
   providing a conductive frame defining first and second rails, a first terminal disposed between the first and second rails, and a plurality of second terminals extending toward the first terminal from one or both of the first and second rails with a respective gap between the first terminal and each second terminal;
   disposing a plurality of unencapsulated capacitor stacks on the conductive frame, each of the stacks comprising one or more capacitors and electrically isolated first and second contacts and being disposed so as to bridge the gap between the first terminal of the conductive frame and one of the second terminals of the conductive frame with the first contact electrically connected to the first terminal of the conductive frame and the second contact electrically connected to the one of the second terminals of the conductive frame;

encapsulating the plurality of stacks; and removing the first and second rails from the conductive frame.

2. The method of claim 1, further comprising deforming at least one of the plurality of second terminals to extend around the plurality of stacks from a first side of the plurality of stacks that faces the conductive frame to a second side of the plurality of stacks opposite the first side.

3. The method of claim 1, wherein the first terminal is connected to the first and second rails by respective first and second segments of the conductive frame.

4. The method of claim 3, further comprising deforming at least one of the first and second segments to extend around the plurality of stacks from a first side of the plurality of stacks that faces the conductive frame to a second side of the plurality of stacks opposite the first side.

5. The method of claim 3, wherein the plurality of second terminals includes at least two second terminals extending toward the first terminal from the first rail.

6. The method of claim 5, wherein the first segment is between an adjacent pair of the at least two second terminals extending toward the first terminal from the first rail.

7. The method of claim 1, wherein the plurality of second terminals includes at least one second terminal extending toward the first terminal from the first rail and at least one second terminal extending toward the first terminal from the second rail.

8. The method of claim 7, wherein the plurality of second terminals includes at least two second terminals extending toward the first terminal from the first rail and at least two second terminals extending toward the first terminal from the second rail.

9. The method of claim 8, wherein the first terminal is connected to the first and second rails by respective first and second segments of the conductive frame, the first segment being between an adjacent pair of the at least two second terminals extending toward the first terminal from the first rail, the second segment being between an adjacent pair of the at least two second terminals extending toward the first terminal from the second rail.

10. A method of manufacturing a semiconductor device, the method comprising:

providing a conductive frame defining first and second rails arranged parallel to each other, a first terminal arranged between the first and second rails, and a plurality of second terminals extending toward the first terminal from one or both of the first and second rails;

disposing a plurality of unencapsulated capacitor stacks on the conductive frame, each of the stacks comprising one or more capacitors and electrically isolated first and second contacts, each stack disposed with the first contact electrically connected to the first terminal of the conductive frame and the second contact electrically connected to a respective one of the second terminals of the conductive frame, wherein a capacitance of a first stack is different from a capacitance of a second stack;

encapsulating the plurality of stacks; and removing the first and second rails from the conductive frame.

11. The method of claim 10, wherein the conductive frame further defines a plurality of connecting bars between the first terminal and the plurality of second terminals, the method further comprising removing at least portions of the connecting bars to electrically isolate the first terminal from the plurality of second terminals.

12. The method of claim 10, further comprising deforming at least one of the plurality of second terminals to extend around the plurality of stacks from a first side of the plurality of stacks that faces the conductive frame to a second side of the plurality of stacks opposite the first side.

13. The method of claim 10, wherein the plurality of second terminals includes at least one second terminal extending toward the first terminal from the first rail and at least one second terminal extending toward the first terminal from the second rail.

14. The method of claim 13, wherein the plurality of second terminals includes at least two second terminals extending toward the first terminal from the first rail and at least two second terminals extending toward the first terminal from the second rail.

15. The method of claim 10, further comprising:

electrically connecting the first terminal of the conductive frame to a ground line of the semiconductor device; and electrically connecting each of the second terminals of the conductive frame to a power rail of the semiconductor device associated with a voltage potential.

16. A method of manufacturing a semiconductor device, the method comprising:

providing a conductive frame defining first and second rails, a first terminal disposed between the first and second rails, and a plurality of second terminals extending toward the first terminal from one or both of the first and second rails with a respective connecting bar between the first terminal and each second terminal;

disposing a plurality of unencapsulated capacitor stacks on the conductive frame, each of the stacks comprising one or more capacitors and electrically isolated first and second contacts, each stack disposed with the first contact electrically connected to the first terminal of the conductive frame and the second contact electrically connected to a respective one of the second terminals of the conductive frame;

encapsulating the plurality of stacks;

removing the first and second rails from the conductive frame; and removing at least portions of the connecting bars from between the first terminal and the respective second terminals.

17. The method of claim 16, further comprising deforming at least one of the plurality of second terminals to extend around the plurality of stacks from a first side of the plurality of stacks that faces the conductive frame to a second side of the plurality of stacks opposite the first side.

18. The method of claim 16, wherein the plurality of second terminals includes at least one second terminal extending toward the first terminal from the first rail and at least one second terminal extending toward the first terminal from the second rail.

19. The method of claim 18, wherein the plurality of second terminals includes at least two second terminals extending toward the first terminal from the first rail and at least two second terminals extending toward the first terminal from the second rail.

20. The method of claim 16, further comprising:

electrically connecting the first terminal of the conductive frame to a ground line of the semiconductor device; and electrically connecting each of the second terminals of the conductive frame to a power rail of the semiconductor device associated with a voltage potential.

* * * * *